United States Patent
Nguyen et al.

(10) Patent No.: US 7,311,779 B2
(45) Date of Patent: Dec. 25, 2007

(54) HEATING APPARATUS TO HEAT WAFERS USING WATER AND PLATE WITH TURBOLATORS

(75) Inventors: Son T. Nguyen, San Jose, CA (US);
Gary J. Rosen, San Carlos, CA (US);
Ian A. Pancham, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 476 days.

(21) Appl. No.: 10/680,359

(22) Filed: Oct. 6, 2003

(65) Prior Publication Data
US 2005/0072526 A1    Apr. 7, 2005

(51) Int. Cl.
*B05C 11/02*    (2006.01)
*B05C 5/00*    (2006.01)
*B05B 7/16*    (2006.01)
*C23C 16/00*    (2006.01)

(52) U.S. Cl. .................. 118/52; 118/300; 118/302; 118/725; 392/418

(58) Field of Classification Search .............. 118/50, 118/52, 612, 319, 320, 724, 725, 300, 302; 219/444.1, 390; 392/418
See application file for complete search history.

(56) References Cited

U.S. PATENT DOCUMENTS

| | | | |
|---|---|---|---|
| 2,953,359 A * | 9/1960 | Mau | 366/146 |
| 4,275,682 A * | 6/1981 | Weber | 118/303 |
| 4,432,635 A | 2/1984 | Mayer et al. | |
| 4,758,926 A | 7/1988 | Herrell et al. | |
| 5,622,593 A | 4/1997 | Arasawa et al. | |
| 5,720,818 A | 2/1998 | Donde et al. | |
| 5,801,442 A | 9/1998 | Hamilton et al. | |
| 5,824,599 A | 10/1998 | Schacham-Diamand et al. | |
| 5,966,940 A | 10/1999 | Gower et al. | |
| 5,998,240 A | 12/1999 | Hamilton et al. | |
| 6,066,575 A | 5/2000 | Reardon et al. | |
| 6,154,369 A | 11/2000 | Martinez, Jr. et al. | |
| 6,177,661 B1 | 1/2001 | Lee et al. | |

(Continued)

FOREIGN PATENT DOCUMENTS

EP    1 209 251    5/2002

(Continued)

OTHER PUBLICATIONS

Partial PCT Search Report for PCT/US04/032879 dated Jan. 11, 2005.

(Continued)

*Primary Examiner*—Yewebdar Tadesse
(74) *Attorney, Agent, or Firm*—Patterson & Sheridan, LLP

(57) ABSTRACT

Embodiments of the invention provide a fluid processing method and apparatus. The apparatus includes a substrate support assembly positioned in a processing volume, a disk shaped member positioned in the processing volume in parallel orientation with a substrate supported on the substrate support assembly, a fluid outlet positioned in a central location of the disk shaped member, and a plurality of turbolators positioned on an upper surface of the disk shaped member, the turbolators being configured to generate a uniform turbulent flow of fluid traveling from the fluid outlet to a perimeter of the substrate. The method includes flowing a heated processing fluid over a plurality of turbolators that are positioned under a substrate being processed to control the temperature of the substrate during processing.

16 Claims, 8 Drawing Sheets

U.S. PATENT DOCUMENTS

| | | | |
|---|---|---|---|
| 6,239,038 B1 * | 5/2001 | Wen ........................... 438/745 |
| 6,463,938 B2 | 10/2002 | Bran | |
| 6,465,765 B2 | 10/2002 | Katayama et al. | |
| 6,666,949 B1 | 12/2003 | Hillman et al. | |
| 2002/0046707 A1 * | 4/2002 | Biberger et al. ............ 118/733 |
| 2002/0083960 A1 | 7/2002 | Wirth et al. | |
| 2003/0118732 A1 * | 6/2003 | Stevens et al. ............. 427/346 |
| 2003/0181040 A1 | 9/2003 | Ivanov et al. | |
| 2004/0052963 A1 | 3/2004 | Ivanov et al. | |
| 2004/0084143 A1 | 5/2004 | Ivanov et al. | |
| 2004/0094186 A1 | 5/2004 | Ivanov | |
| 2004/0097071 A1 | 5/2004 | Ivanov | |
| 2005/0072525 A1 | 4/2005 | Pancham et al. | |

OTHER PUBLICATIONS

PCT International Search Report for PCT/US04/032879 dated Apr. 6, 2005.

PCT Written Opinion for PCT/US04/032879 dated Apr. 6, 2005.

* cited by examiner

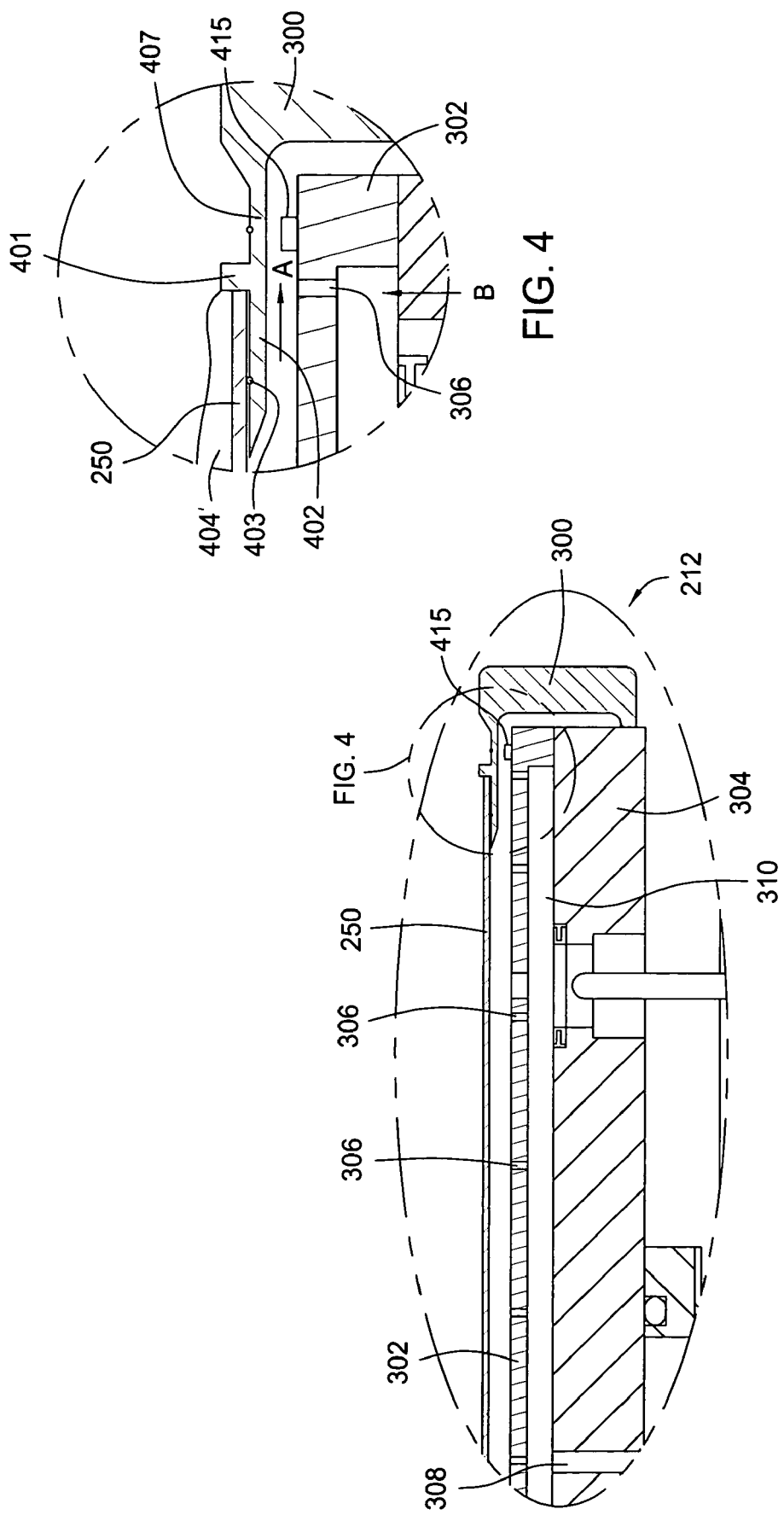

HEATING APPARATUS TO HEAT WAFERS USING WATER AND PLATE WITH TURBOLATORS

BACKGROUND OF THE INVENTION

1. Field of the Invention

Embodiments of the invention generally relate to an apparatus and method for controlling the temperature of a substrate during fluid processing.

2. Description of the Related Art

The semiconductor processing industry relies upon several methods for depositing conductive materials onto substrates, such as silicon wafers or large area glass substrates, for example. More particularly, deposition methods such as physical vapor deposition, chemical vapor deposition, and electrochemical plating are commonly used to deposit conductive materials or metals onto substrates and into features. Another deposition method that has been used in the semiconductor processing industry is electroless plating. However, electroless plating techniques have presented challenges to producing uniform deposition of conductive materials.

One challenge with electroless deposition processes is that they are highly dependent upon temperature, i.e., if one portion of a substrate is as little as 1° C. warmer than another portion of the substrate, then the warmer portion of the substrate will experience a substantial increase in the electroless deposition plating rate as compared to the cooler portion of the substrate. This difference in the deposition rate in the warmer areas of the substrate causes uniformity variations, and as such, electroless plating processes have generally not been favored for semiconductor processing. However, if substrate temperatures could be properly controlled, electroless deposition could provide advantages to semiconductor processing techniques in areas such as seed layer repair, capping, feature filling, etc.

Another challenge with respect to electroless deposition cells is achieving effective backside sealing. The electroless deposition chemistry generally has surfactants and other constituents that tend to diffuse to the back of the substrate, resulting in contamination and/or deposition on the backside of the substrate. As such, there is a need for an electroless deposition cell configured to control substrate temperature such that a uniform electroless deposition process may be conducted and prevent surfactants and other processing chemicals from contacting the backside of the substrate.

SUMMARY OF THE INVENTION

Embodiments of the invention generally provide a fluid processing cell configured to control the temperature of a substrate during processing. The cell generally includes a substrate support assembly positioned in a processing volume, a disk shaped member positioned in the processing volume in parallel orientation with a substrate supported on the substrate support assembly, a fluid outlet positioned in a central location of the disk shaped member, and a plurality of turbolators positioned on an upper surface of the disk shaped member, the turbolators being configured to generate a uniform turbulent flow of fluid traveling from the fluid outlet to a perimeter of the substrate.

Embodiments of the invention may further provide an electroless deposition cell for semiconductor substrates. The cell generally includes a substrate support assembly positioned in a cell body, a fluid distribution member in parallel relationship with a substrate positioned on the substrate support assembly, a plurality of turbolators positioned on the fluid distribution member, a fluid delivery aperture formed into a central portion of the fluid distribution member and configured to dispense a heating fluid onto a backside of the substrate, an electroless fluid dispensing member positioned to dispense an electroless processing solution onto a frontside of the substrate, and a source of heated fluid in fluid communication with the fluid delivery aperture.

Embodiments of the invention may further provide an electroless deposition method. The method generally includes positioning a substrate face up on a substrate support member, positioning a fluid distribution member below a backside of the substrate, the fluid distribution member having a central fluid dispensing aperture formed therein and a plurality of fluid turbolators positioned thereon, dispensing an electroless processing solution onto a production surface of the substrate, dispensing a heated fluid into a space between the backside of the substrate and the fluid distribution member via the central fluid dispensing aperture while the electroless processing solution id dispensed onto the production surface, and generating a turbulent uniform outward flow of the heated fluid across the backside of the substrate by passing the heated fluid over the turbolators.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 illustrates an enlarged sectional view of the substrate support member of the exemplary processing cell illustrated in FIG. 2a.

FIG. 4 illustrates a detailed view of the perimeter of the substrate support member illustrated in FIG. 3.

DETAILED DESCRIPTION OF THE PREFERRED EMBODIMENT

Figure 1:
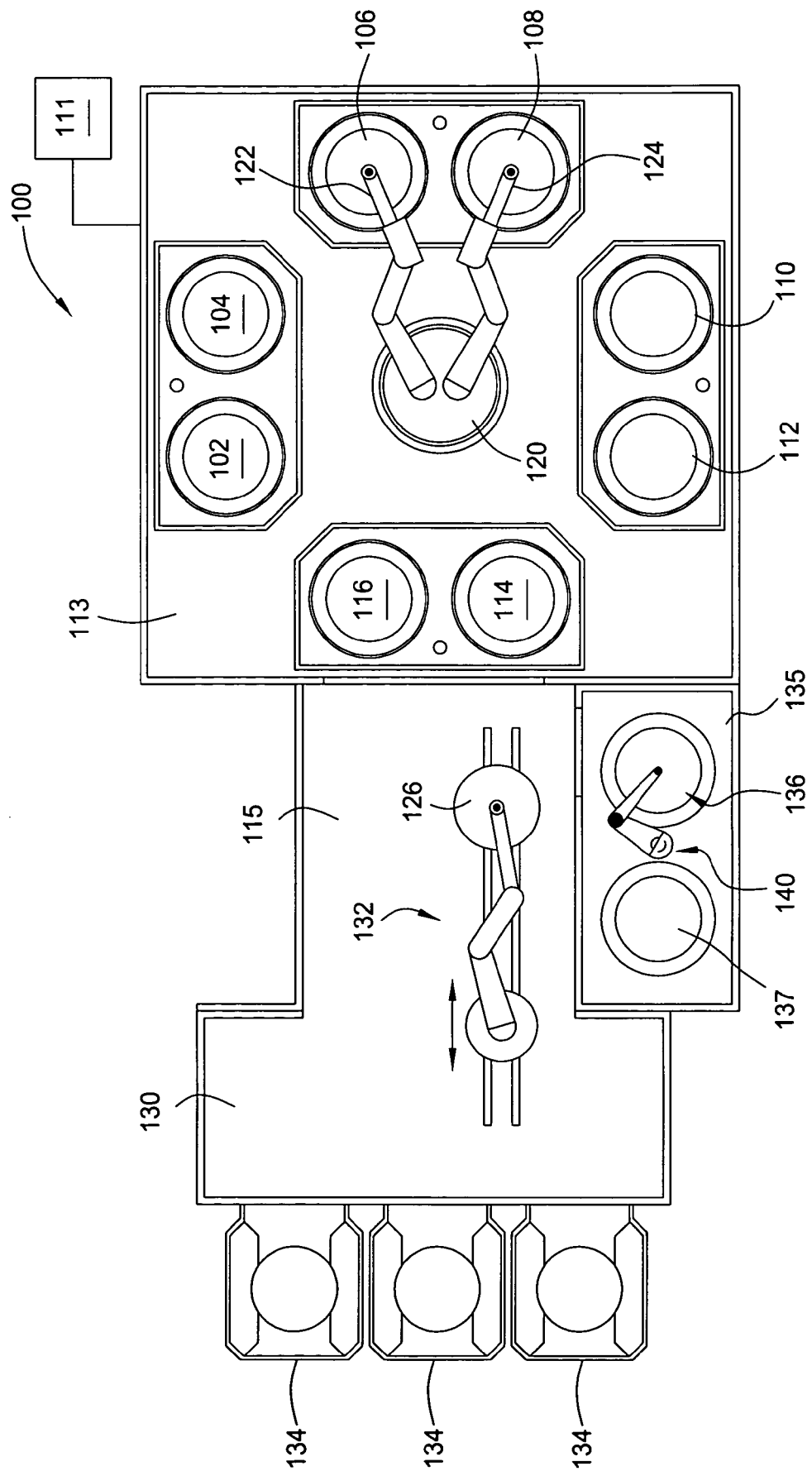
FIG. 1 illustrates a plan view of an exemplary processing platform configured to contain one or more of the processing cells of the invention.

FIG. 1 illustrates an exemplary processing platform 100 that may be used to implement embodiments of the invention. The exemplary processing platform, which is generally a semiconductor processing platform such as an electrochemical plating platform, for example, includes a factory interface 130, which is also generally termed a substrate loading station. Factory interface 130 includes a substrate loading station configured to interface with a plurality of substrate containing cassettes 134. A robot 132 is positioned in factory interface 130 and is configured to access substrates 126 contained in the cassettes 134. Further, robot 132 also extends from the link tunnel 115 to processing mainframe or platform 113. The position of robot 132 allows the robot to access substrate cassettes 134 to retrieve substrates therefrom and then deliver the substrates 126 to one of the processing cells 114, 116 positioned on the mainframe 113, or alternatively, to an annealing station 135. Similarly, robot 132 may be used to retrieve substrates from the processing cells 114, 116 or the annealing station 135 after a substrate processing sequence is complete. In this situation robot 132 may deliver the substrate back to one of the cassettes 134 for removal from platform 100.

The anneal station 135 generally includes a two station annealing chamber, wherein a cooling plate 136 and a heating plate 137 are positioned adjacently with a substrate transfer robot 140 positioned proximate thereto, e.g., between the two stations. The robot 140 is generally configured to move substrates between the respective heating 137 and cooling plates 136. Further, although the anneal chamber 135 is illustrated as being positioned such that it is accessed from the link tunnel 115, embodiments of the invention are not limited to any particular configuration or placement. As such, the anneal station 135 may be positioned in direct communication with the mainframe 113, i.e., accessed by mainframe robot 120, or alternatively, the annealing station 135 may be position in communication with the mainframe 113, i.e., the annealing station may be positioned on the same system as mainframe 113, but may not be in direct contact with the mainframe 113 or accessible from the mainframe robot 120. For example, as illustrated in FIG. 1, the anneal station 135 may be positioned in direct communication with the link tunnel 115, which allows for access to mainframe 113, and as such, the anneal chamber 135 is illustrated as being in communication with the mainframe 113.

Processing platform 100 also includes transfer robot 120 centrally positioned (generally) on the processing mainframe 113. Robot 120 generally includes one or more arms/blades 122, 124 configured to support and transfer substrates. Additionally, robot 120 and the accompanying blades 122, 124 are generally configured to extend, rotate, and vertically move so that the robot 120 may insert and remove substrates to and from a plurality of processing locations 102, 104, 106, 108, 110, 112, 114, 116 positioned on the mainframe 113. Similarly, factory interface robot 132 also includes the ability to rotate, extend, and vertically move its substrate support blade, while also allowing for linear travel along the robot track that extends from the factory interface 130 to the mainframe 113. Generally, process locations 102, 104, 106, 108, 110, 112, 114, 116 may be any number of processing cells utilized on a semiconductor processing plating platform. More particularly, the process locations may be configured as electrochemical plating cells, rinsing cells, bevel clean cells, spin rinse dry cells, substrate surface cleaning cells (which collectively includes cleaning, rinsing, and etching cells), electroless plating cells, metrology inspection stations, and/or other processing cells that may be beneficially used in conjunction with a plating platform. Each of the respective processing cells and robots are generally in communication with a process controller 111, which may be a microprocessor-based control system configured to receive inputs from both a user and/or various sensors positioned on the system 100 and appropriately control the operation of system 100 in accordance with the inputs.

Figure 2A:
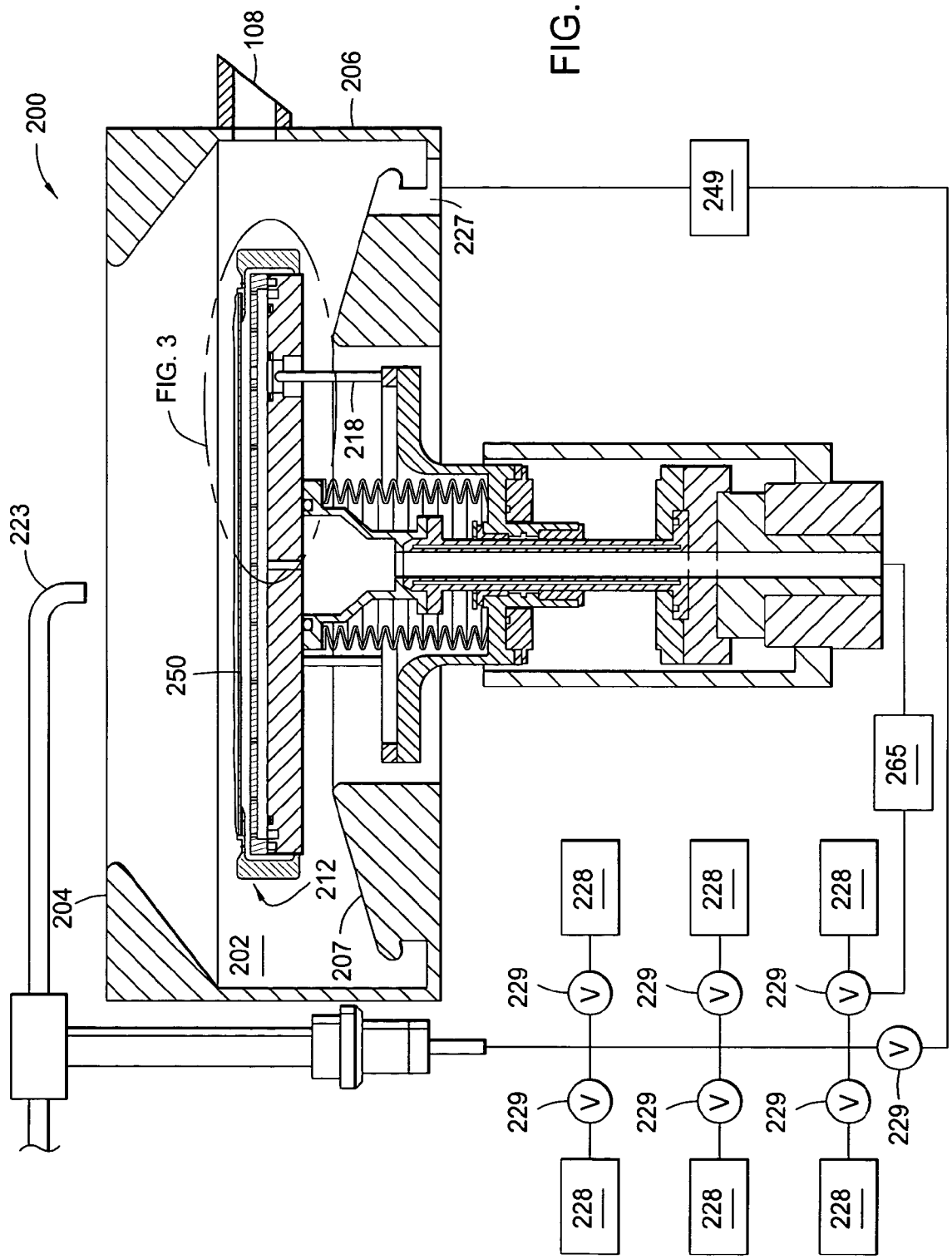
FIG. 2a illustrates a sectional view of an exemplary processing cell of the invention.

FIG. 2a illustrates a schematic cross-sectional view of one embodiment of a processing cell 200 of the invention. Processing cell 200, which is generally a semiconductor processing fluid processing cell configured to plate a conductive material onto a substrate, may be positioned at any one of processing cell locations 102, 104, 106, 108, 110, 112, 114, 116 illustrated in FIG. 1. Alternatively, processing cell 200 may be implemented as a stand alone plating cell, or in conjunction with another substrate processing platform. Processing cell 200 generally includes a processing compartment 202 that includes a top 204 (optional), sidewalls 206, and a bottom 207. The sidewalls 206 may include an opening or access valve 108 positioned therein that may be used to insert and remove substrates from the processing compartment 202. A rotatable substrate support 212 is generally disposed in a central location of the bottom member 207 of the processing cell 200 and optionally includes a substrate lift pin assembly 218 configured to lift the substrate 250 off of the substrate support member 212. The substrate support 212 is generally configured to receive a substrate 250 in a "face-up" position for processing, and as such, the lift pin assembly 218 may be generally configured to engage a backside or non-production surface of the substrate 250 to lift the substrate off of the substrate support member 212.

The processing cell 200 further includes a fluid dispensing arm assembly 223 configured to dispense a processing fluid onto the substrate 250 while it is positioned on the substrate support member 212. The fluid dispensing arm assembly 223 is generally in fluid communication with at least one fluid supply source 228 via at least one fluid supply valve 229. As such, multiple chemicals may be mixed and supplied to the fluid dispensing arm assembly 223. Additionally, at least one of the fluid sources 228 is in fluid communication with a heater 265, which is also in fluid communication with a central aperture (illustrated as 308 in FIG. 3) formed into the substrate support member 212. Heater 265, which may be any type of heater used to heat fluids for a semiconductor processing cell, is generally configured to accurately control the temperature of the fluid dispensed therefrom. More particularly, heater 265 may be in communication with one or more temperature sensors (not shown) and/or one or more controllers (not shown) configured to regulate the output temperature of the fluid dispensed by heater 265 in accordance with an open loop or a closed loop control system, for example.

The fluid processing cell 200 further includes a fluid drain 227 positioned in the bottom portion 207 of the processing cell 200. Drain 227 may be in fluid communication with a fluid recirculation or reclamation device 249 that is configured to refresh or replenish collected processing fluid and then return the processing fluid to one or more of the fluid sources 228, for example. The fluid processing cell 200 may further includes an exhaust (not shown) that can be controlled automatically based on process conditions.

FIG. 3 illustrates a more detailed view of the exemplary substrate support member 212. The substrate support member 212 generally includes a base plate member 304 and a fluid diffusion member 302 attached thereto. A plurality of substrate support fingers 300 are generally positioned proximate the perimeter of the fluid diffusion member 302 and are configured to support a substrate 250 thereon at a positioned above the fluid diffusion member 302. Alternatively, the plurality of substrate support fingers 300 may be replaced with a continuous substrate support ring member (not shown). In the configuration where the continuous ring is implemented, generally the above noted lift pin assembly will also be used. However, in embodiments where the plurality of fingers 300 are used, then a robot blade may be inserted below the substrate and between the fingers 300 to lift and remove the substrate.

The base plate member 304 generally includes a solid disk shaped member having a fluid passage 308 formed through a central portion thereof, or through another location on the plate 304. The fluid diffusion member 302 is generally positioned in communication with the base plate member 304 in a configuration that generates a fluid volume 310 between the base plate member 304 and the fluid diffusion member 302. The fluid volume 310 may generally have a spacing between the fluid diffusion member 302 and the base plate 304 of between about 2 mm and about 15 mm, however, larger or smaller spacing may be used as needed.

The fluid diffusion member 302 further includes a plurality of bores/fluid passages 306 formed therethrough that connect an upper surface of the member to a lower surface of the member and fluid volume 310. A perimeter portion of the fluid diffusion member 302 is generally in sealed communication with the base plate member 304, and as such, fluid may be introduced into the fluid volume 310 by fluid inlet 308 and caused to flow through the bores 306 formed in the diffusion member 302 as a result of the increasing fluid pressure generated in the sealed fluid volume 310 by the fluid introduction.

The base plate 304 and diffusion member 302 may be manufactured from a ceramic material (such as fully pressed Aluminium Nitride, alumina $Al_2O_3$, silicon carbide (SiC)), a polymer coated metal (such as Teflon™ polymer coated aluminum or stainless steal), a polymer material, or other material suitable for semiconductor fluid processing. Preferred polymer coatings or polymer materials are fluorinated polymers such as Tefzel (ETFE), Halar (ECTFE), PFA, PTFE, FEP, PVDF, etc.

Figure 2B:
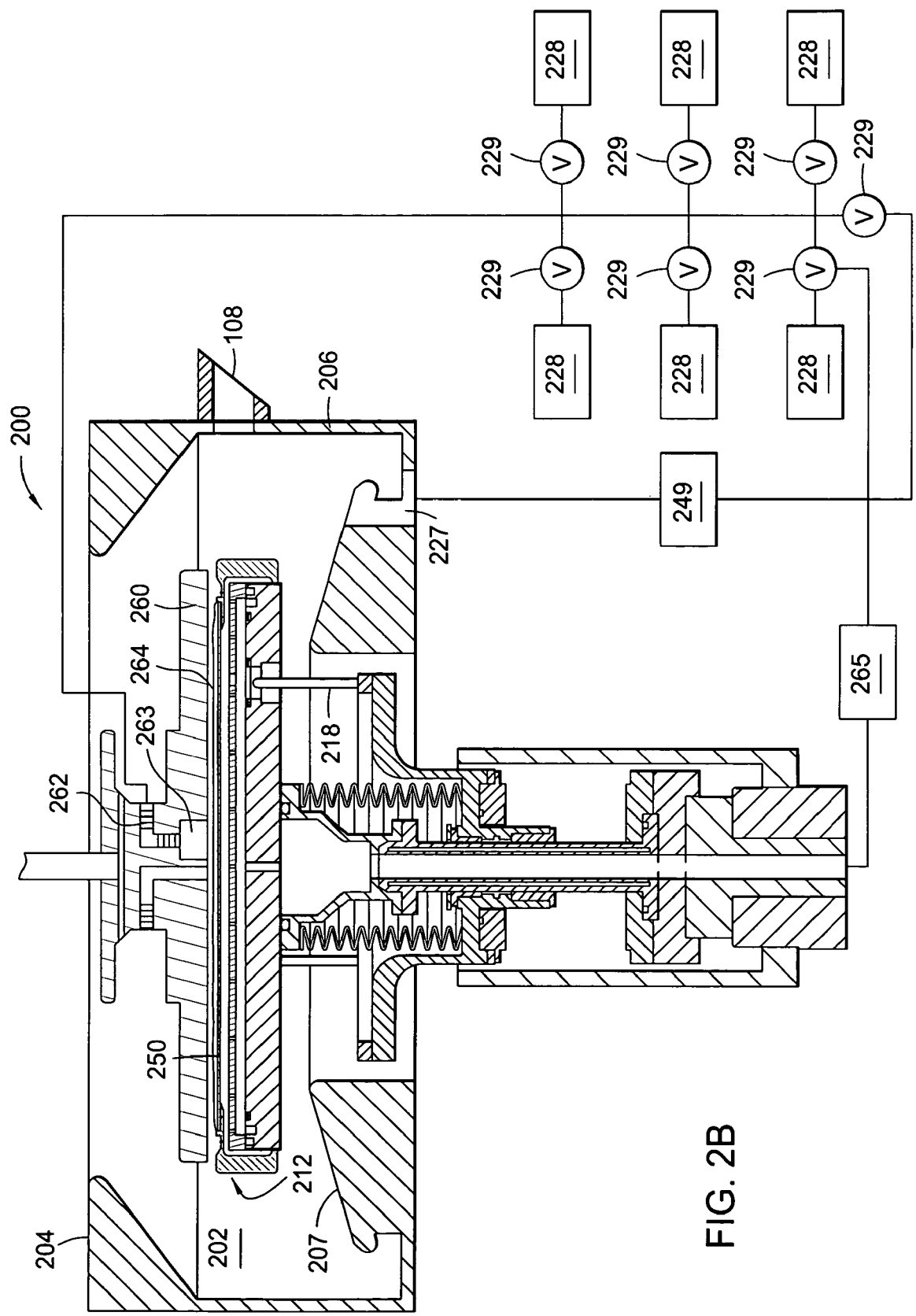
FIG. 2b illustrates sectional view of another exemplary processing cell of the invention.

FIG. 2b illustrates sectional view of another exemplary processing cell of the invention. The processing cell 201 illustrated in FIG. 2b is similar to the processing cell 200 illustrated in FIG. 2a, and as such, numbering has been preserved where applicable. Processing cell 201 includes an environmental shield 260 that is generally positioned above the substrate support member 212. The environmental shield is configured to be vertically movable so that the shield 212 may be moved between a processing position (a position where shield 260 is positioned adjacent a substrate 250 positioned on support fingers 402) and a loading/unloading position (a position where the shield 260 is elevated above the substrate support member 212 to allow for access to the processing volume 202 by a robot or shuttle, for example). In the processing position, the environmental shield 260 is positioned such that a lower planar surface of the shield 260 is parallel to the substrate 250 and spaced therefrom at a distance of between about 2 mm and about 15 mm, for example, which generates a fluid volume 264 between the shield 260 and the substrate 250. The shield 260 may include a fluid inlet 262 and outlet 263, which may be in fluid communication with the processing fluid sources 228 and used to supply a processing fluid to the substrate surface and the fluid volume 264.

FIG. 4 illustrates a more detailed view of the perimeter of the substrate support member illustrated in FIG. 3. The substrate support fingers 300 are illustrated as having an elongated arm portion 407 that extends inwardly and terminates in a support member 402. Support member 402 is generally configured to provide support to the perimeter of the substrate 250 being processed, and the support member 402 may include a support post 403 configured to engage the substrate 250. The support post 403 is generally manufactured from a material configured to prevent damage to the substrate 250 positioned thereon, and as such, post 403 is generally manufactured from a relatively soft material that is not likely to scratch the substrate 250, such as plastics and other non-metal materials that are amenable to semiconductor processing fluids. The arm portion 407 may also include an upstanding member 401 positioned radially outward of the perimeter of the substrate 250. The upstanding members 401 may cooperatively operate to center the substrate between the respective members 401 for processing. In this embodiment, fluid flows upward through the holes 306 (as illustrated by arrow "B" in FIG. 4) formed in the diffusion member 302 into the processing volume defined between the lower surface of the substrate 250 and the upper surface of the diffusion member 302. The processing fluid then flows radially outward across the lower surface of the substrate 250 (as illustrated by arrow "A" in FIG. 4). The outer perimeter of the diffusion plate 302 may include a raised portion 415, which is configured to assist with bubble removal from the area below the substrate.

In an alternative embodiment of the invention, the plurality of fingers may include a continuous ring support member. In this embodiment the support post 403 may be replaced with a seal, such as an o-ring seal, and the plurality of fingers may be replaced with a continuous annular ring having an inner diameter that is smaller that an outer diameter of the substrate being processed. In this embodiment, the fluid passing through the diffusion member 302 may be collected by a first receiving means (not shown) positioned below the ring member 300, while the processing fluid dispensed onto the top or production surface of the substrate 250 may be collected by a second receiving means (not shown) positioned above and/or outward of the ring member. This embodiment allows for separation and reclamation of the respective fluids used to contact the front side and back side of the substrate.

Figure 5:
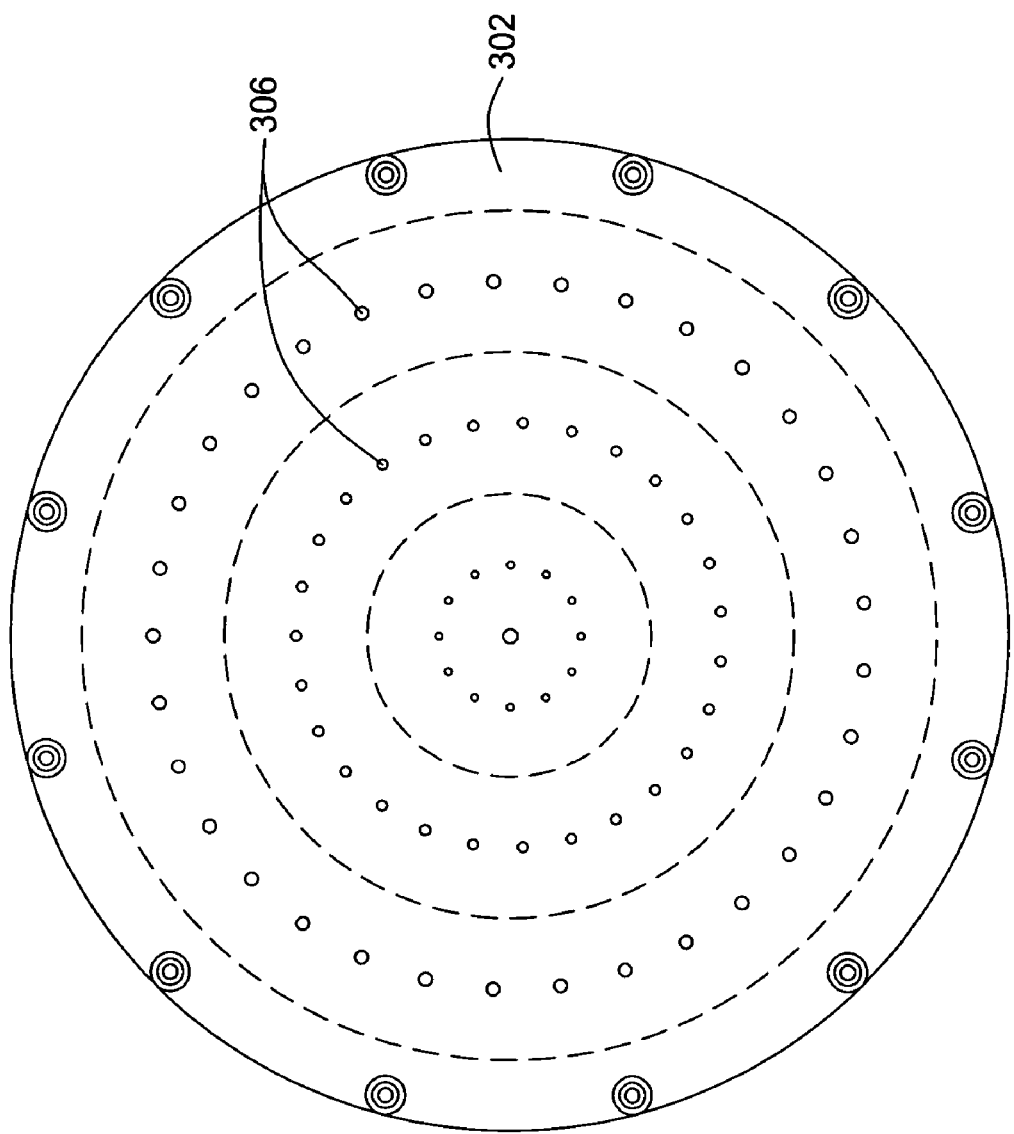
FIG. 5 illustrates a plan view of an embodiment of the fluid diffusion member of the invention.

FIG. 5 illustrates a plan view of an embodiment of the substrate support member 212 of the invention. More particularly, FIG. 5 illustrates the upper surface of the fluid diffusion member 302, i.e., the surface of the fluid diffusion member 302 that faces the substrate when a substrate is positioned on the support fingers 300 for processing. The upper surface includes a plurality of radially positioned holes 306 (positioned outward of a center of the surface) that are in fluid communication with the fluid volume 310 positioned between the lower surface of the fluid diffusion member 302 and the upper surface of the base member 304. As such, the heated fluid that is introduced into the fluid volume 310 is caused to flow through each of the apertures or holes 306, and when the fluid contacts the lower or underside of the substrate 250 positioned on the fingers 300, then the fluid travels radially outward toward the perimeter of the substrate 250. Further, the holes 306 are generally positioned in circular bands around a generally centrally located fluid aperture 306 positioned near the geometric center of the fluid diffusion member 302. The diameter of the holes 306 may be constant across the upper surface. Alternatively, the diameter of the holes 306 may increase as the distance from the center of the upper surface increases. For example, the holes 306 positioned nearest the center of the fluid diffusion member 302 may have a diameter that is about 20% of the diameter of the outermost holes 306 (those positioned proximate the perimeter) on the fluid diffusion member 302. Alternatively, the size of the holes 306 may remain constant as the radial bands increase in distance from the center of the diffusion member 302, however, in this situation the number of holes 306 also generally increases with each radial band away from the center of the diffusion member 302.

Regardless of the configuration of the holes 306, the intention of the positioning of holes 306 is to generate uniform heating of the substrate. As such, the holes are generally positioned such that the heated fluid dispensed therefrom maintains a constant temperature as it travels outward across the backside surface of the substrate. More particularly, the positioning, spacing, and sizes of the respective holes 306 is configured to generate a uniform temperature profile across the backside of the substrate 250 positioned for processing. Generally, this is accomplished by increasing the number of holes 306 to dispense the heated fluid as the radial distance from the center of the substrate increases and/or increasing the size of the fluid dispensing holes 306 as the distance from the center of the substrate increases. In one embodiment, this configuration may generate a continuous and even flow of the heated fluid traveling radially outward across the entire backside area of the substrate, which generally facilitates even heating of the substrate by the fluid. Further, the positioning of the holes is also configured to maintain a turbulent flow of the heating fluid as is travels radially outward across the backside of the substrate. More particularly, as the fluid travels radially outward from the center of the diffusion member, the fluid flow tends to become more laminar. Laminar fluid flow has been shown to exhibit poor heat transfer characteristics as a result of boundary layers forming in the laminar flow. As such, the individual bands or rings of holes 306 are generally positioned such that additional heating fluid is introduced into the area between the diffusion member 302 and substrate 250 at a position where the heating fluid flow tends to lose its turbulent effect and become laminar. The introduction of additional fluid increases turbulence in the fluid, while also increasing the temperature.

In another embodiment of the invention, the diffusion member 302 includes a heating assembly. The heating assembly may generally include one or more resistive heaters 502 positioned in the interior of the diffusion member 302. The heaters 502 may be configured as a plurality of circularly positioned heaters positioned in the space between the bands of holes 306. In this configuration, each of the respective heaters 502 may be individually controlled to optimize the temperature control over the substrate. More particularly, the outer heaters 502 may be energized more than inner heaters 502, such that the heaters may be used to compensate for fluid cooling as the fluid travels toward the edge of the substrate 205. Further, a plurality of temperature sensors may be implemented in conjunction with the heaters, and a controller may be used to monitor temperature and adjust the power to the respective heaters 502 to equalize the temperature across the backside of the substrate 250. In yet another embodiment of the invention, a heater may also be implemented in the supporting structure for the diffusion member 302. More particularly, a heater may be implemented to pre-heat the substrate support assembly (base plate, diffusion member, etc.) prior to the heated fluid being flowed therethrough, as preheating has been shown to minimize thermal loss and further increase the temperature uniformity at the substrate.

With regard to temperature uniformity, embodiments of the invention have been implemented into the exemplary processing cell 200 of the invention, wherein the processing cell 200 was configured to conduct an electroless copper deposition process. In this configuration the fluid dispensing arm assembly 223 was configured to dispense an electroless plating solution onto a substrate surface (the substrate being positioned on the fingers 300 in the processing cell 200), and as such, one or more of the fluid sources 228 includes the constituents of an electroless solution. Additionally, at least one of fluid sources 228 (the fluid source 228 in fluid communication with the heater 265) is a source of deionized water (DI). In this configuration a substrate is positioned in the cell 200, while an electroless solution is dispensed on the upwardly facing surface of the substrate by the fluid dispensing arm assembly 223 and heated DI is dispensed against the backside of the substrate by the fluid diffusion member 302.

However, since electroless deposition processes are known to be sensitive to temperature, and more particularly, since electroless deposition rates are known to be dependent upon temperature, i.e., electroless deposition rates generally increase exponentially with temperature, it becomes critical to uniform electroless deposition to maintain all areas of the substrate at a uniform temperature during the electroless deposition process. As such, the configuration of the fluid diffusion member 302 of the invention, i.e., the positioning and sizing of the holes 306, in conjunction with the ability to control the output of the heater 265 and/or the heater in the diffusion member 302, may be used to accurately control an electroless deposition process. For example, the inventors have found that annular or ring shaped hole 306 patterns with an increasing density of holes 306 as the diameter of the rings increases provides a temperature variation across the surface of the substrate (a 200 mm substrate for example) under processing conditions of between about 0.8° C. and 2° C. Generally, the spacing and sizing of the holes 306 may be determined such that as the area of the substrate increases moving radially outward form the center of the substrate, then the volume of heated fluid supplied to cover or heat the area of the substrate is proportionally increased, which essentially provides fresh heated fluid to all areas across the substrate surface.

Figure 6:
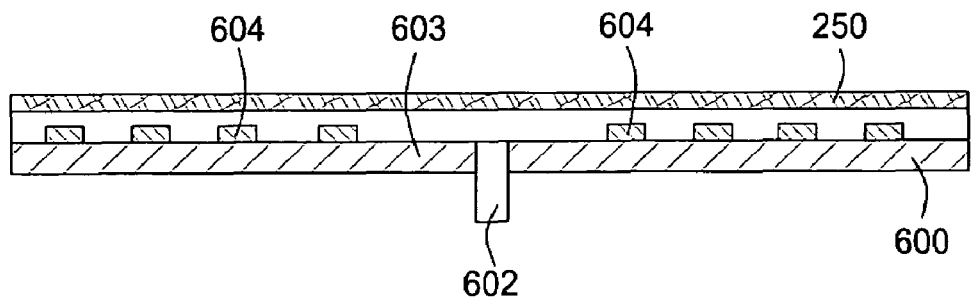
FIG. 6 illustrates a sectional view of an alternative fluid diffusion member of the invention.
Figure 7:
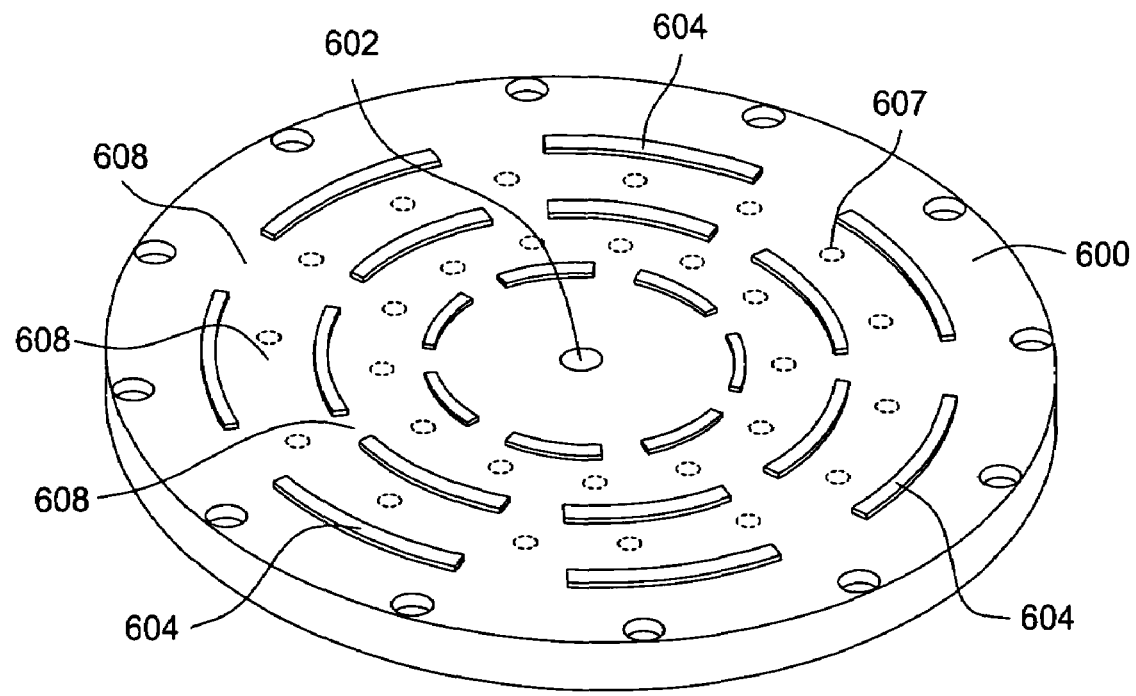
FIG. 7 illustrates a top perspective view of the fluid diffusion member illustrated in FIG. 6.
Figure 8:
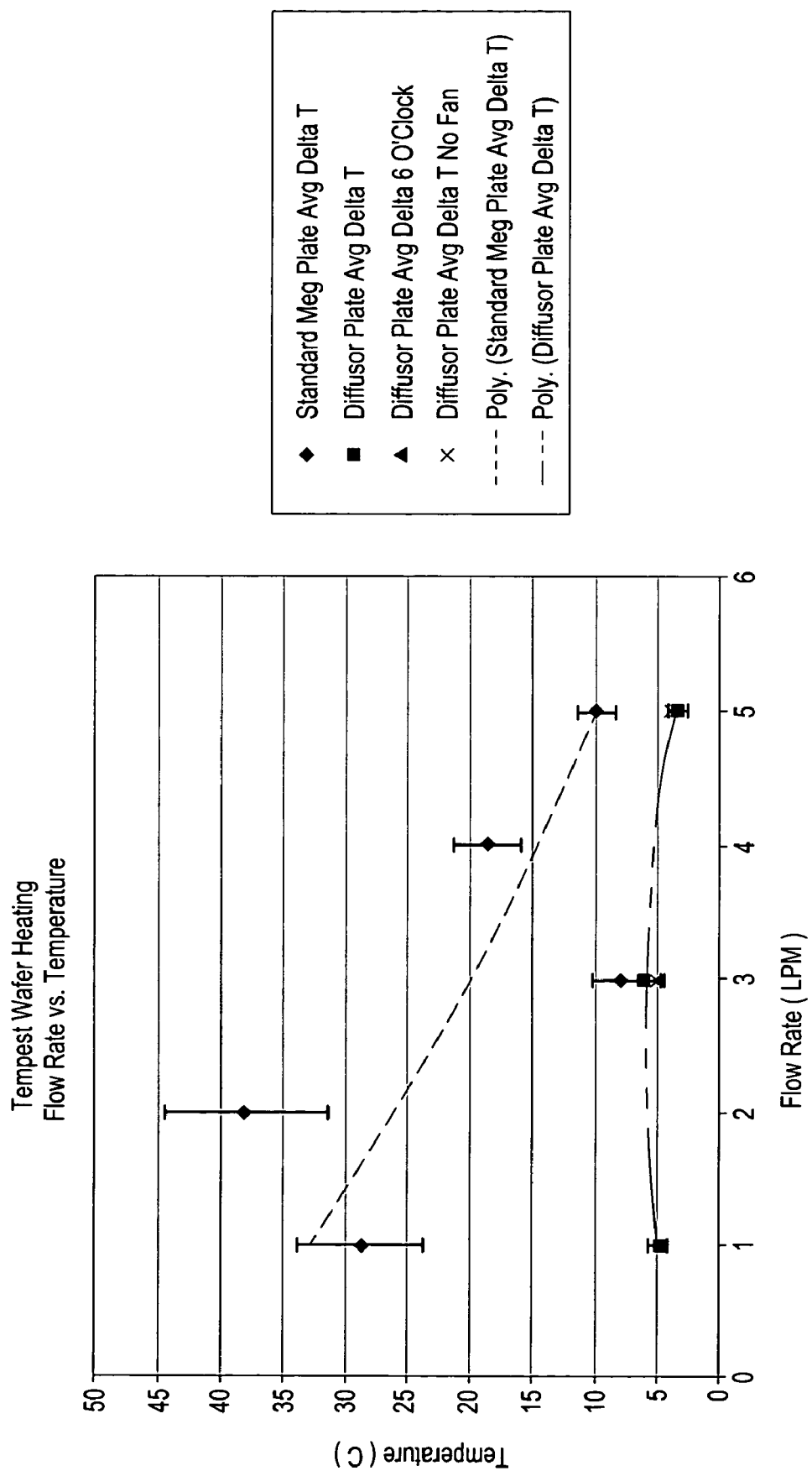
FIG. 8 illustrates the relationship between the flow rate of a fluid to the backside of a substrate and the temperature of the diffusion member of the invention and a conventional plate.

For example, FIG. 8 illustrates the relationship between the flow rate of a heated fluid to the backside of a substrate using the embodiment of the invention illustrated in FIGS. 6 and 7, and the temperature of the heated fluid for a fluid processing apparatus having a substantially planar plate behind the substrate, i.e., no turbolators 604 or fluid diffusion member 302. The graph illustrates that a conventional fluid processing cell heating configuration (a central fluid dispensing assembly that provides the heated fluid to the center of the substrate backside and allows the heated fluid to flow outward) exhibits a substantially greater temperature variation across the backside plate than the diffuser plate 302 of the invention. More particularly, the temperature delta for a conventional cell is about 20° C., while the temperature delta for embodiments of the present invention is less than about 2° C. Thus, the plot of FIG. 8 illustrates that the diffuser plate of the invention reduces max-min temperature, and further, the decouples temperature uniformity from flow rate.

Table 1 illustrates three exemplary hole placement configurations of the invention. The band number represents the circular band or placement of the holes away from the center of the diffusion plate, and the radius indicates the distance (or radius) of the band from the center of the diffusion plate.

The number of holes column indicates how many holes or bores are included in the particular band. For each of the holes in the following cases, the hole or bore diameter tested was 2 mm.

TABLE I

| Band Number | Radius (mm) | Number of Holes |
|---|---|---|
| CASE 1 | | |
| 1 | 25 | 12 |
| 2 | 50 | 18 |
| 3 | 75 | 24 |
| 4 | 100 | 30 |
| 5 | 125 | 36 |
| CASE 2 | | |
| 1 | 5 | 5 |
| 2 | 25 | 12 |
| 3 | 75 | 24 |
| 4 | 125 | 36 |
| CASE 3 | | |
| 1 | 0 | 1 |
| 2 | 25 | 6 |
| 3 | 50 | 12 |
| 4 | 75 | 18 |
| 5 | 125 | 30 |

Figure 9:
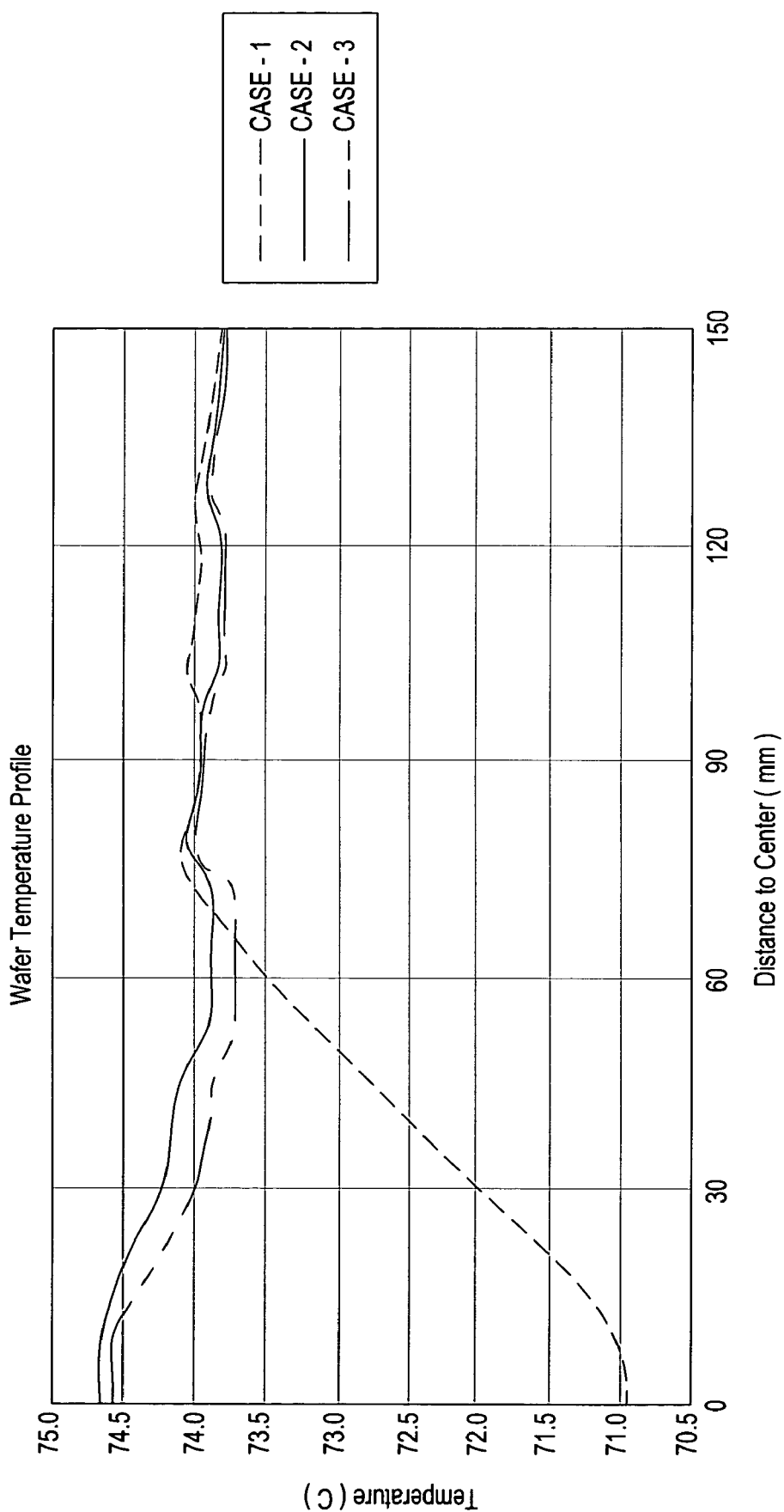
FIG. 9 illustrates the relationship between the distance from the center of the substrate and the temperature of the substrate for the three cases of the invention.

FIG. 9 illustrates the relationship between the distance from the center of the diffusion member and the temperature for the three cases of the invention illustrated in Table I. More particularly, the data of FIG. 9 illustrates a temperature of less than about 1° C. from the center of a substrate to the edge (for a 300 mm substrate) using the embodiments of the invention illustrated in cases 2 and 3 of Table I.

FIG. 6 illustrates a sectional view of an alternative fluid diffusion member of the invention. The fluid diffusion member 600 generally includes a disk shaped member having a central aperture or fluid passage 602 formed therethrough. The fluid passage is generally in fluid communication with a fluid supply and/or a heater (not shown) configured to control the temperature of fluid dispensed therefrom. An upper surface 603 of the diffusion member 600 includes a plurality of turbolators 604 positioned thereon. The turbolators 604 generally include a raised portion extending upward from the upper surface 603. The turbolators may generally have a height (extension above the upper surface 203) of between about 1 mm and about 4 mm. As such, the substrate 250 is generally positioned for processing such that the lower surface of the substrate is between about 1 mm and about 5 mm above the tops of the turbolators 604. Further, the turbolators are generally-arc shaped in plan, as illustrated in the perspective plan view of FIG. 7, and are positioned in a circular pattern around the central fluid aperture 602. The turbolators are further positioned such that the terminating ends of the respective turbolators 604 are positioned adjacent the terminating ends of the closest positioned turbolators 604, thus generating a fluid gap 608 between the respective turbolators 604. In this configuration, the circularly positioned turbolators 604 are positioned such that the fluid gap 608 in a first inner ring of turbolators 604 is positioned such that fluid flow through the fluid gap 608 is directed over a turbolator 604 in a second ring of turbolators 604 positioned radially outward of the first inner ring of turbolators 604.

In this configuration a substrate is again supported by fingers 300, for example, at a position above the fluid diffusion member 600. A heated fluid is pumped through aperture 602, and as a result of the substrate being positioned immediately above the fluid diffusion member 600, the fluid exiting from aperture 602 is caused to flow outward toward the perimeter of the substrate and fluid diffusion member 600. As a result of the positioning of the turbolators 604, the outward flow of the fluid passes over at least two of the turbolators 604. When the fluid passes over the turbolators, turbulence is introduced into the fluid flow, i.e., the generally laminar outward flow generated adjacent the fluid aperture 602 is caused to be turbulent as the fluid flows over the turbolators 604. The introduction of turbulent flow to the heated fluid has been shown to provide a more even temperature gradient across the surface of a substrate, which, as mentioned above, facilitates deposition uniformity in electroless plating processes.

In another embodiment of the invention, the fluid diffusion member illustrated in FIG. 3 may be combined with the fluid diffusion member illustrated in FIG. 6. In this embodiment a fluid diffusion member having both turbolators 604 and a plurality of radially positioned fluid dispensing holes 607 may be used in combination to generate a substantially uniform temperature across the surface of a substrate being processed. In this embodiment, which is illustrated in FIG. 7, the fluid dispensing holes 306 may be positioned at essentially any location between the respective turbolators, and further, may be formed through the turbolators if desired.

While the foregoing is directed to embodiments of the present invention, other and further embodiments of the invention may be devised without departing from the basic scope thereof, and the scope thereof is determined by the claims that follow.

The invention claimed is:

1. A fluid processing cell configured to control the temperature of a substrate during processing, comprising:
    a substrate support assembly positioned in a processing volume;
    a disk shaped member positioned in the processing volume in parallel orientation with a substrate supported on the substrate support assembly;
    a fluid outlet formed in a central location of the disk shaped member; and
    a plurality of turbolators extending upward from an upper surface of the disk shaped member, the turbolators being configured to generate a uniform turbulent flow of fluid traveling from the fluid outlet to a perimeter of the substrate.

2. The fluid processing cell of claim 1, wherein the turbolators comprise arc shaped members positioned radially around the fluid outlet.

3. The fluid processing cell of claim 2, wherein the turbolators are positioned in concentric annular rings around the fluid outlet.

4. The fluid processing cell of claim 3, wherein the turbolators in an inner ring define a fluid passage therebetween, the fluid passage being in alignment with a turbolator in an outer ring.

5. The fluid processing cell of claim 4, wherein the arc shaped members comprise between about 4 and about 6 arc shaped members per annular ring.

6. The fluid processing cell of claim 1, further comprising a plurality of fluid dispensing holes positioned adjacent the plurality of turbolators.

7. The fluid processing cell of claim 1, wherein the turbolators extend vertically from the upper surface a distance of between about 1 mm and about 4 mm.

8. The fluid processing cell of claim 1, wherein the substrate support assembly is configured to support the substrate at a position that is between about 3 mm about 5 mm from the disk shaped member.

9. The fluid processing cell of claim 1, wherein the fluid outlet is in communication with a source of heated fluid.

10. An electroless deposition cell for semiconductor substrates, comprising:
- a substrate support assembly positioned in a cell body;
- a fluid distribution member in parallel relationship with a substrate positioned on the substrate support assembly;
- a plurality of turbolators extending upward from the fluid distribution member;
- a fluid delivery aperture formed into a central portion of the fluid distribution member and configured to dispense a heating fluid onto a backside of the substrate, wherein the plurality of turbolators are configured to generate a uniform turbulent flow of fluid traveling from the fluid delivery aperture to a perimeter of the fluid distribution member;
- an electroless fluid dispensing member positioned to dispense an electroless processing solution onto a frontside of the substrate; and
- a source of heated fluid in fluid communication with the fluid delivery aperture.

11. The electroless deposition cell of claim 10, wherein the plurality of turbolators comprise arc shaped members positioned end to end with a fluid space therebetween in a circular pattern around the fluid delivery aperture.

12. The electroless deposition cell of claim 11, further comprising at least two concentric circular patterns of turbolators.

13. The electroless deposition cell of claim 12, wherein the turbolators have a height from the distribution member of between about 1 mm and about 3 mm.

14. The electroless deposition cell of claim 13, wherein the substrate support assembly is configured to support the substrate at a distance of between about 3 mm and about 5 mm from the fluid distribution assembly.

15. The electroless deposition cell of claim 12, wherein the fluid space of the inner ring is positioned radially inward of a turbolator of an outer ring.

16. The electroless deposition cell of claim 12, further comprising a plurality of fluid distribution apertures formed into an upper surface of the fluid distribution member proximate the turbolators.

* * * * *